United States Patent [19]
>
> Rauscher

[11] Patent Number: 4,631,500
[45] Date of Patent: Dec. 23, 1986

[54] MICROWAVE FREQUENCY DIVIDER HAVING REGENERATIVE OSCILLATION

[75] Inventor: Christen Rauscher, Fort Washington, Md.

[73] Assignee: The United States of America as represented by the Secretary of the Navy, Washington, D.C.

[21] Appl. No.: 603,382

[22] Filed: Apr. 24, 1984

[51] Int. Cl.⁴ .......................................... H03B 19/00
[52] U.S. Cl. ............................. 331/51; 331/117 FE; 333/218; 363/159; 455/333; 307/219.1
[58] Field of Search .................. 333/218; 307/219.1, 307/271; 328/15, 16, 25; 331/51, 117 FE; 363/157, 158, 159; 455/321, 333

[56] References Cited

U.S. PATENT DOCUMENTS

| 2,738,423 | 5/1956 | Sziklai | 328/15 X |
|---|---|---|---|
| 3,179,812 | 4/1965 | Schrecongost | 328/25 X |
| 3,305,730 | 2/1967 | Parzen | 363/157 X |
| 3,316,478 | 4/1967 | Polaniełcki | 363/158 |
| 3,863,136 | 1/1975 | Hanson | 307/219.1 |
| 3,921,056 | 11/1975 | Mahoney | 333/218 |
| 4,152,680 | 5/1979 | Harrison | 333/218 X |
| 4,176,332 | 11/1979 | Bachert | 333/218 |
| 4,219,779 | 8/1980 | Shinkawa et al. | 455/333 X |
| 4,327,343 | 4/1982 | Cornish | 333/218 |
| 4,334,324 | 6/1982 | Hoover | 455/333 |

FOREIGN PATENT DOCUMENTS

0025894 4/1981 European Pat. Off. .............. 331/51

OTHER PUBLICATIONS

Lee, Han C; "Subhormone Generation Using Transistor and Subhormone Suppression in Transistor Amplifier"; RCA Technical Notes; RCA TN No. 702, Jan. 1967.
C. Rauscher, A 16 GHz GaAs FET Frequency Divider 1983 IEEE MTTS Digest, pp. 349-351.
R. G. Harrison and T. W. Tucker, Frequency Division Solves Systems Problems Communications, Oct. 1978, pp. 97-101.
R. G. Harrison, A Broad-Band Frequency Divider Using Microwave Varactors IEEE Transactions on Microwave Theory and Techniques vol. MTT-25, No. 12, Dec. 77, pp. 1055-1059.
R. L. Miller, Fractional-Frequency Generators Utilizing Regenerative Modulation, Proceedings of the I.R.E. Jul. 1939, pp. 446-457.

Primary Examiner—Eugene R. LaRoche
Assistant Examiner—Benny T. Lee
Attorney, Agent, or Firm—Sol Sheinbein; John L. Forrest

[57] ABSTRACT

A microwave frequency divider circuit. The frequency divider comprises a nonlinear amplifier including input and output ports for amplifying signals applied to the input port. The amplifier exhibits a nonlinear transconductance characteristic between its input and output ports. The amplifier input port is adaptable to receive a first signal having a frequency $f_I$. The frequency divider further includes a feedback network coupled between the amplifier output and input ports to couple a second signal having a frequency $f_o$ appearing at the amplifier output port back to the input port. The first and second signals combine at the amplifier input port to modulate the nonlinear transconductance of the amplifier such that said first and second signals are mixed together and amplified. The circuit regeneratively oscillates such that the frequency $f_o$ equals a frequency $f_I/2$. The frequency $f_I$ of the first signal is thus divided by the circuit.

2 Claims, 5 Drawing Figures

MICROWAVE FREQUENCY DIVIDER HAVING REGENERATIVE OSCILLATION

BACKGROUND OF THE INVENTION

The present Invention is directed generally to a novel frequency divider and, more particularly, to a novel analog regenerative frequency divider for use at high microwave frequencies.

Microwave systems, such as radar and communications systems, frequently employ extensive signal processing subsystems. For reasons of economy and design simplicity, it is usually desirable to perform signal processing functions at frequencies much lower than that upon which the microwave system operates. Microwave systems thus typically employ frequency divider circuits to effect a down-conversion of the original microwave signal to a more easily processed frequency range.

There are basically two different types of microwave frequency dividers: regenerative dividers, and circuits that operate as or-like digital dividers. The present Invention is a novel member of the regenerative divider family.

FIG. 1 illustrates a typical prior art regenerative frequency divider generally designated by reference numeral 10. The frequency divider 10 includes a mixer circuit 12 having a first input 14 coupled to receive a signal of frequency $f_{IN}$ to be divided in frequency. A second input 16 is coupled to receive a fed back output signal at a frequency $f_{OUT}=f_{IN}/2$. The mixer 12 mixes the two input signals of frequencies $f_{IN}$ and $f_{OUT}$ to produce a signal at a frequency $f_X$ at its output port 18 having components at frequencies given by:

$$f_X = f_{IN} \pm f_{OUT} = \begin{cases} 3f_{OUT} \\ f_{OUT} \end{cases}$$

The signal $f_X$ is fed to a filter network 20 which passes signal components at the frequency $f_{OUT}$ and rejects signals at the frequency $3f_{OUT}$. The $f_{OUT}$ output of the filter network 20 is amplified by an amplifier 22 to produce an output signal at frequency $f_{OUT}$ appearing on signal line 24 which is the frequency divided output signal of the divider 10.

A portion of the output signal at $f_{OUT}$ appearing on line 24 is fed back through a feedback network 26 to the second input 16 of the mixer 12. The gain of the amplifier 22 must be sufficient to overcome all system losses, allowing the overall loop gain at frequency $f_{OUT}$ to exceed unity for input signals at frequency $f_{IN}$ above a certain turn-on threshold level. Due to the positive feedback involved, and the potential instability that can result therefrom, a finite threshold level must be designed into the circuit to guard against undesired spurious oscillations in the absence of an input signal.

Presently available frequency divider circuits for use at microwave frequencies make use of pumped varactor diodes to simultaneously accomplish both the mixing and amplifying functions. A variation on the varactor mixer design is shown in U.S. Pat. No. 4,327,343. The frequency divider described in that patent makes use of the gate-to-source varactor diode of a field-effect transistor (FET) to provide both mixing and subharmonic parametric amplification. The regular amplification properties of the FET are not used in the generation of the frequency divided subharmonic signal.

Microwave frequency dividers using varactor mixers, including circuits which use discrete varactors and those which use FET's as a varactor, all exhibit certain inherent limitations related to varactor losses. These intrinsic losses lead to a built-in minimum threshold level that cannot be reduced by circuit design and thus places an often severe and undesirable limitation on the circuit design. Further, the inherently reactive nature of varactors greatly complicates the design of efficient, stable, and economical frequency dividers for use at microwave frequencies.

The present Invention provides a novel frequency divider for use at high microwave frequencies which is not subject to the above-discussed limitations.

SUMMARY OF THE INVENTION

Accordingly, one object of the present Invention is to provide a novel frequency divider for use at microwave frequencies.

Another object is to provide a novel regenerative frequency divider for use at microwave frequencies wherein the regenerative threshold level is completely controllable.

Yet another object is to provide a novel regenerative frequency divider for use at microwave frequencies which is highly efficient while being inherently simple to design and implement.

These and other objects and advantages are provided by a novel microwave frequency divider circuit according to the present invention which comprises a nonlinear amplifier means for amplifying signals applied to the input port. The nonlinear amplifier has an input port and an output port. The amplifier exhibits a nonlinear transconductance characteristic between its input and output ports. The amplifier has an input port which is adaptable to receive a first signal having a frequency $f_1$. The frequency divider 1 urther includes a feedback means for coupling a second signal having a frequency $f_o$ appearing at the amplifier output port back to the amplifier input port. The first and second signals are combined at the amplifier input port to modulate the nonlinear transconductance characteristic of the amplifier such that said first and second signals are mixed together and amplified. The circuit regeneratively oscillates such that the frequency $f_o$ is half the frequency $f_1/2$. The frequency $f_1$ of the first signal is thus divided by the circuit.

BRIEF DESCRIPTION OF THE DRAWINGS

A more complete appreciation of the Invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
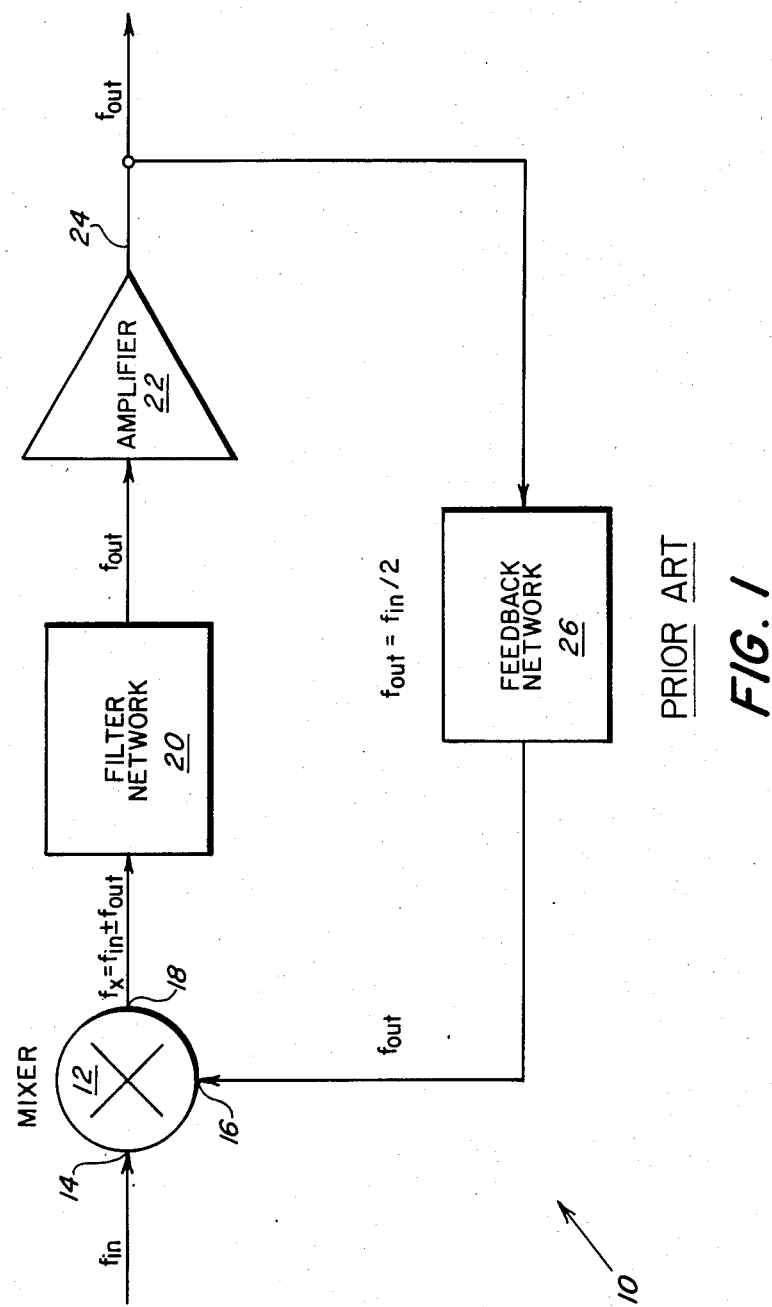
FIG. 1 is a schematic illustration of a prior art regenerative frequency divider.
Figure 2:
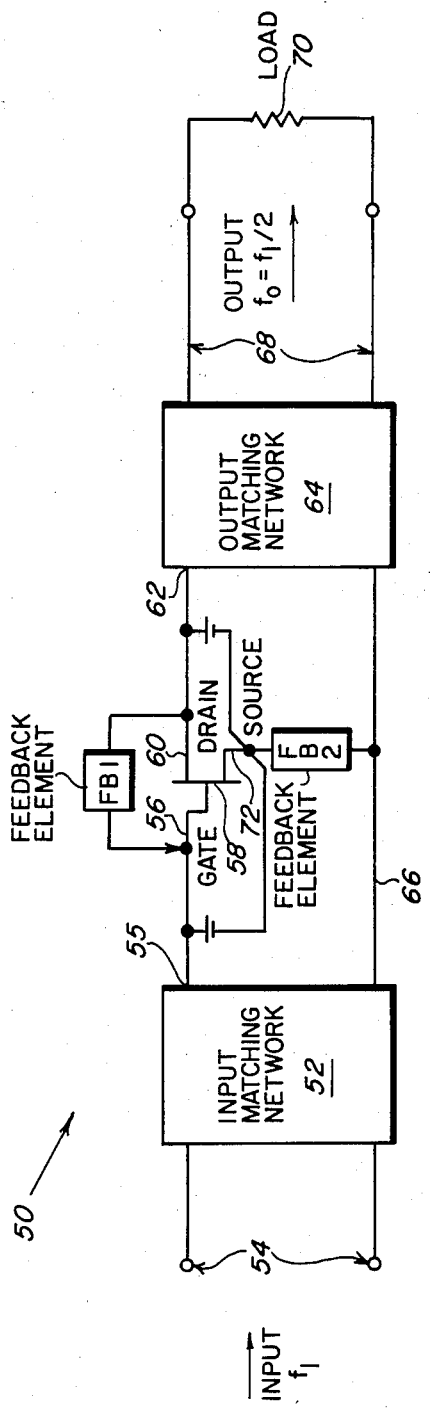
FIG. 2 is a schematic block diagram of a frequency divider according to a preferred embodiment of the present Invention.

Referring now to the drawings, wherein the reference numerals and characters designate corresponding parts through the several views, and more particularly to FIG. 2 thereof, a general block diagram of a microwave frequency divider 50 according to the present Invention is illustrated.

The frequency divider 50 includes an input matching network 52 coupled to receive an input signal having a frequency $f_1$ at its input port 54. The output 55 of the input matching network 52 is coupled to the gate electrode 56 of a microwave FET (field-effect transistor) 58. The drain electrode 60 of the FET 58 is coupled to an input 62 of an output matching network 64. A common conductor 66 joins the input and output matching networks 52 and 64, respectively. The output port 68 of the output matching network 64 is coupled to supply an output signal $f_o=f_1/2$ to a load 70. A first feedback element FB1 is coupled between the drain electrode 60 and the gate electrode 56 of the FET 58. A second feedback element FB2 is coupled between the source electrode 72 of the FET 58 and the common conductor 66.

The input matching network 52 acts to match the impedance of the source of the input signal $f_1$ (not illustrated) to the gate 56 of the FET 58. Additionally, the input matching network 52 acts to block any subharmonic signals, such as the output signal $f_o$, generated by the FET 58 from leaving the frequency divider 50 via the input port 54. Similarly, the output matching network 64 matches the impedance of the drain 60 of the FET 58 to the impedance of the load 70 while blocking any components of the input signal $f_1$ from reaching the load 70.

The FET 58 performs both mixing and amplification functions. The FET 58 is biased to near pinch off by well-known biasing means. As such, the FET operates as an amplifier having a nonlinear transfer characteristic. Additionally, in order to insure the stability of the circuit, the FET gain is set through selection of the FET gate-to-source bias such that the divider circuit responds only to signals having amplitudes which exceed a given threshold level.

Upon receipt at the FET gate 56 of a signal $f_1$ having an amplitude in excess of the threshold level, an amplified replica of the signal $f_1$ appears at the FET drain 60. At the same time, noise signals present at the gate 56 are also amplified to appear at the drain 60.

Feedback element FB1 provides regenerative feedback at the frequency $f_o=f_1/2$ by coupling signal components at frequency $f_o$ (initially noise components) appearing at the FET drain 60 back to the FET gate 56. Additional regenerative feedback at the frequency $f_o$ is provided by the feedback element FB2. In a practical implementation of the present Invention regenerative feedback may be provided through element FB1 exclusively, through element FB2 exclusively, or through an appropriate combination of these two feedback methods.

The input signal $f_1$ and the $f_o$ feedback signal developed from system noise combine at the FET gate 56 where together they modulate the nonlinear transconductance characteristics of the FET 58 in the vicinity of pinch-off to perform a mixing function thereby developing $f_1-f_o=f_o$ and $f_1+f_o=3f_1/2$ frequency components at the FET drain 60. Thus $f_1=2f_o$. Due to the feedback provided by feedback elements FB1 and FB2 and the amplification provided by the FET 58, substantial growth of the subharmonic $f_o$ signal occurs thereby providing subharmonic oscillation. The mixing operation performed by the FET is highly efficient and is a far more efficient way to provide mixing than relying on the lossy gate-to-source varactors of the FET as the primary system nonlinearity as the prior art.

As previously discussed, in addition to mixing FET 58 provides amplification for the feedback loop comprising feedback elements FB1, FB2, and the FET 58. As such, the amplifying capabilities of the FET participate fully in the subharmonic feedback loop, permitting convenient control over loop gain and thus over the critical turn-on threshold for the regenerative process. The threshold level is set by the amount of gate-to-source DC bias voltage applied to the FET and by the design of the feedback elements. This is in contrast to varactor-type frequency dividers wherein the threshold is primarily a function of the inherent varactor or FET gate-to-source characteristics and is hence not controllable.

Figure 3:
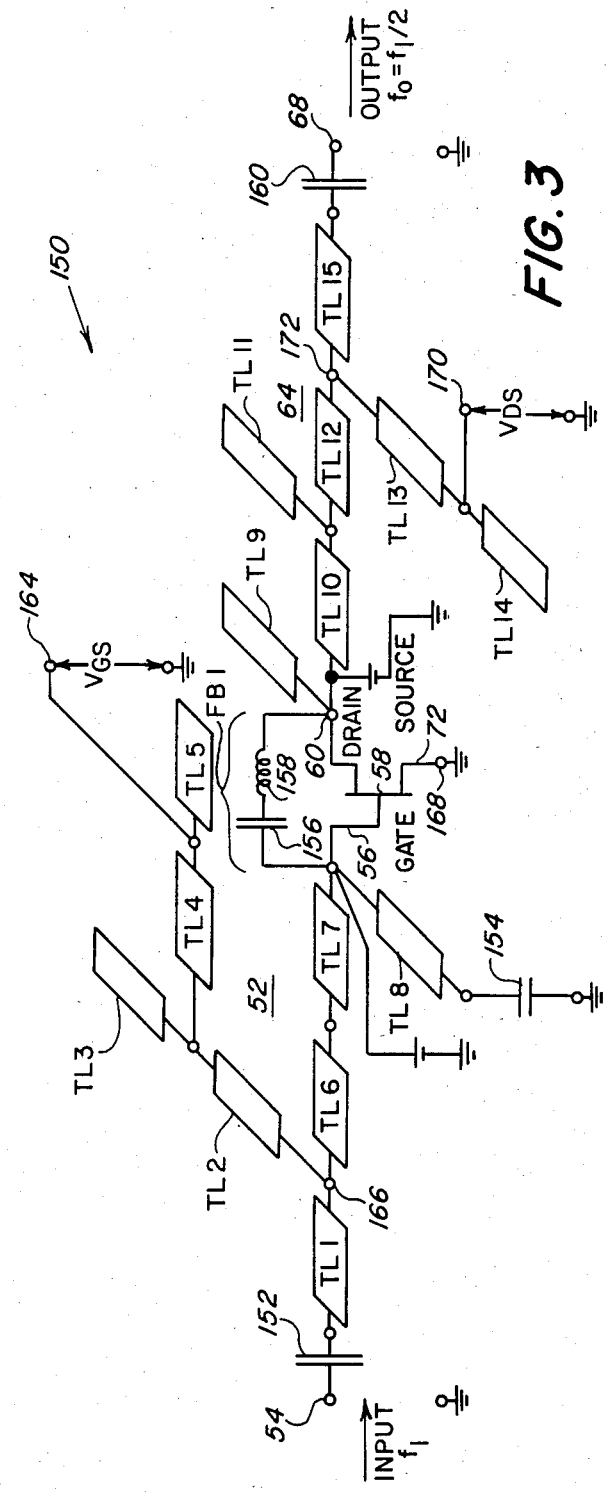
FIG. 3 is a strip-line schematic diagram of a frequency divider circuit according to a preferred embodiment of the present Invention.

FIG. 3 is a strip-line schematic diagram which illustrates a frequency divider 150 according to a preferred embodiment of the present Invention. The frequency divider 150 follows the block diagram of the frequency divider 50 shown in FIG. 2, with common elements correspondingly identified in FIGS. 2 and 3. Thus, in FIG. 3 capacitors 152 and 154 and transmission line elements TL1 through TL8 form the input matching network 52; capacitor 156 and inductor 158 form the feedback element FB1; and capacitor 160 and transmission line elements TL9 through TL15 form the output matching network 64.

An input signal $f_1$ applied to input terminal 54 is coupled through capacitor 152 and the series connected transmission line elements TL1, TL6, and TL7 to the gate 56 of the FET 58. The capacitor 152 acts to block DC voltages within the divider 150 while passing the signal $f_1$. The transmission line elements TL1, TL6, TL7, TL8, and DC blocking capacitor 154 act to match the impedance of the FET gate 56 to a standard 50 ohm input impedance at frequency $f_1$. Transmission line elements TL2, TL3, TL4, and TL5 form a gate biasing network to couple the gate-to-source bias voltage $V_{GS}$ applied to terminal 164 to circuit node 166 and ultimately through transmission line elements TL6 and TL7 to the FET gate 56. Transmission line elements TL2 and TL4 present an open circuit at frequency $f_1$ to node 166, thereby preventing signal components at the frequency $f_1$ from reaching the terminal 164. Transmission line elements TL2 and TL3 present a short circuit at frequency $f_o$ to node 166 to further decouple the terminal 164 and to eliminate $f_o$ frequency signals at node 166 thus preventing signals at frequency $f_o$ from reaching the input source (not illustrated) coupled to terminal 54.

The feedback element FB1 comprises capacitor 156 and inductor 158 which form a series nonresonant circuit at the frequency $f_o$. The feedback element FB1 couples $f_o$ signal components developed at the FET drain 60 back to the FET gate 56 to provide regenerative feedback. The feedback element will block the $3f_1/2$ signal component appearing at the drain 60 if the quality factor Q of the tuned circuit is sufficiently high.

The source 72 of the FET 58 is coupled to ground at point 168. A certain inherent impedance will always be present in the terminal leads of any real electronic component. Thus the source lead of FET 58 will exhibit a small impedance which effectively forms the second feedback element FB2 shown in FIG. 2.

The $f_o$ signal appearing at the FET drain 60 is coupled to the frequency divider output terminal 68 via the series connected transmission line elements TL10, TL12, and TL15 and by the DC blocking capacitor 160. The transmission line elements TL10, TL12, and TL15, together with transmission line stubs TL9 and TL11, serve to transform the FET drain impedance at $f_o$ to a standard 50 ohm output impedance. Transmission line element TL11 appears as a short circuit at the frequency $f_1$ to prevent remanants of the input signal $f_1$ from appearing at the output terminal 68. The transmission line elements TL13 and TL14 act as a drain biasing network to couple drain-to-source bias voltage $V_{DS}$ from a terminal 170 to a circuit node 172 and ultimately through the transmission line elements TL12 and TL10 to the FET drain 60. Transmission line elements TL13 and TL14 present an open circuit at frequency $f_o$ to node 172 to effectively decouple the terminal 170 from RF signals, recalling that the $f_1$ signal has already been blocked by stub TL11.

In a preferred practical embodiment, the frequency divider 150 illustrated in FIG. 3 was implemented in microstrip on a 0.25 mm thick fiberglass reinforced TEFLON ™ substrate to affect a 16 GHz ($f_1$) to 8 GHz ($f_o$) frequency division. FET 58 was one cell of an AVANTEK ™ M110 GaAs field effect transistor having a gate length of 0.5 μm, a gate width of 375 μm, and a pinch-off voltage of $-2.9$ V. Inductor 158 was a 5 nH air coil inductor formed from seven turns of 25 μm diameter gold wire having an approximate coil diameter of 300 μm. Capacitors 152, 154, and 160 were 20 pF and capacitor 156 was 5 pF, all silicon nitride units. The drain-to source DC bias voltage $V_{DC}$ was $+3.0$ V while the gate-to source DC bias voltage $V_{GS}$ was adjustable between $-2.2$ V and $-3.0$ V.

Table I lists the characteristic impedance Zo and the electrical length $\theta$ at 16 GHz for the transmission line elements TL1 through TL15. These electrical characteristics completely characterize these elements such that they may be duplicated on any substrate material, as should be apparent to those of skill in the art.

TABLE I

| Transmission Line Element Electrical Characteristics at 16 GHz | | |
|---|---|---|
| Transmission Line Element | Characteristic Impedance Zo (OHMS) | Electrical Length $\theta$ (Degrees) |
| TL1 | 95 | 33.5 |
| TL2 | 95 | 90 |
| TL3 | 95 | 90 |
| TL4 | 95 | 180 |
| TL5 | 40 | 180 |
| TL6 | 95 | 56.5 |
| TL7 | 42 | 75 |
| TL8 | 51 | 71 |
| TL9 | 80 | 43 |
| TL10 | 70 | 90 |
| TL11 | 80 | 90 |
| TL12 | 80 | 130 |
| TL13 | 95 | 180 |

TABLE I-continued

| Transmission Line Element Electrical Characteristics at 16 GHz | | |
|---|---|---|
| Transmission Line Element | Characteristic Impedance Zo (OHMS) | Electrical Length $\theta$ (Degrees) |
| TL14 | 40 | 180 |
| TL15 | 42 | 180 |

Figure 4:
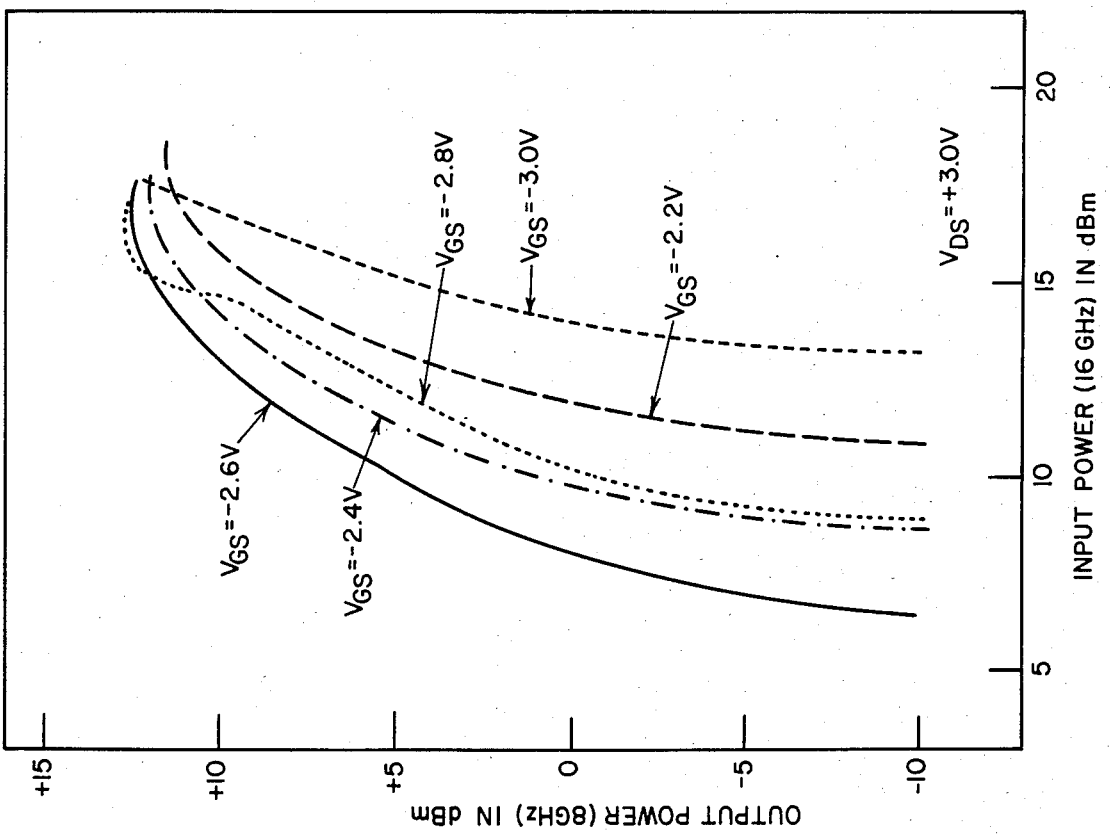
FIG. 4 is a plot of the measured output power as a function of the incident input power and DC gate to-source voltage for the frequency divider according to the present Invention as shown in FIG. 3.

FIG. 4 is a plot of the measured output power as a function of the incident input power and DC gate-to-source bias voltag $V_{GS}$ for the practical preferred embodiment of the frequency divider 150 according to the present Invention described above and shown in FIG. 3. As should be apparent from the curves of FIG. 4, the gate-to-source bias voltage $V_{GS}$ has a direct effect on the turn-on threshold, e.g., the input power level which must be exceeded before the regenerative process can start. For example, a nominal design with $V_{GS} = -2.6$ V offers high sensitivity with a threshold of 6.5 dBm. The threshold level may be reduced to any arbitrarily low level through appropriate adjustment of the FET contribution to overall loop gain by adjusting the $V_{GS}$ bias voltage and by adjusting the amount of feedback provided. Toward the upper end of the input power scale, the output response curves level off as the subharmonic oscillation approaches saturation. In between the extremes of threshold and saturation is a narrow range where the divider response can be considered to be reasonably linear. However, the limited dynamic range, which may result in a partial loss of original input amplitude information, is not specific to the frequency divider of the present Invention, but is a characteristic of the regenerative process itself.

Figure 5:
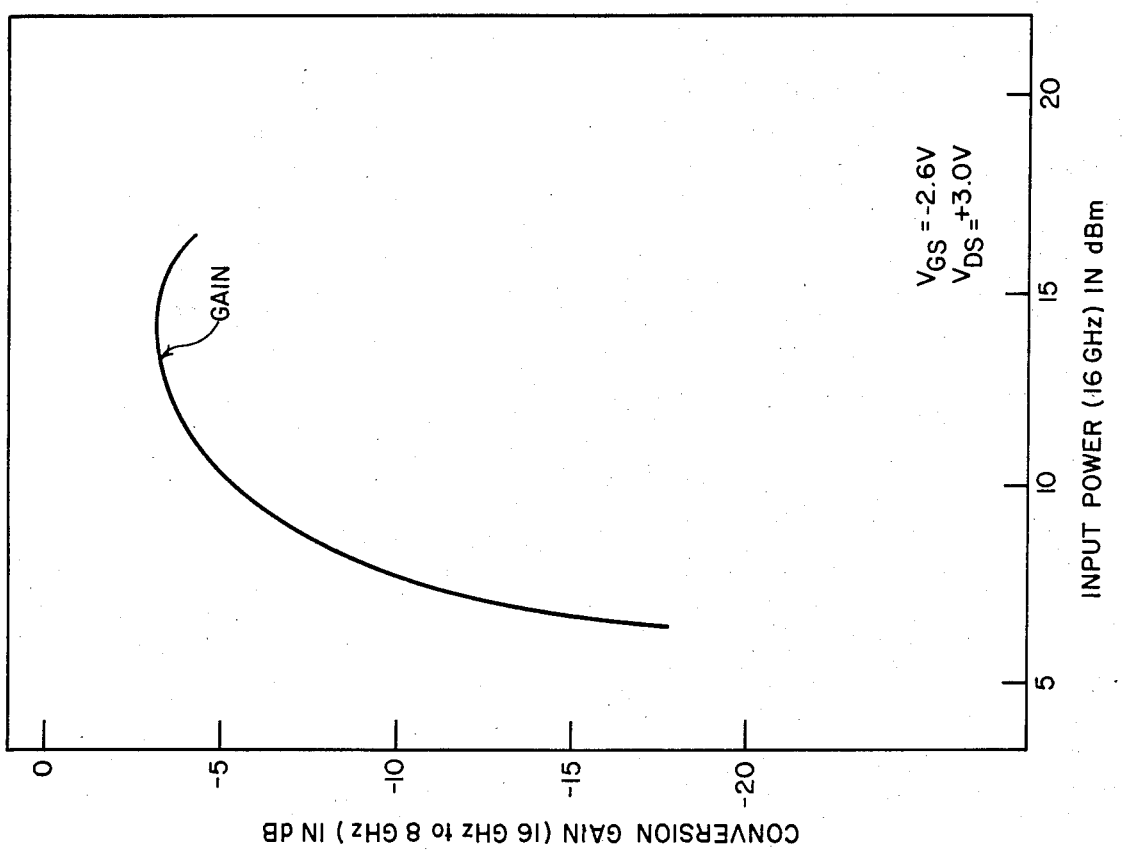
FIG. 5 is a plot of the microwave input-to-output conversion gain as a function of input power for the frequency divider according to the present Invention as shown in FIG. 3.

FIG. 5 is a plot of the microwave input-to-output conversion gain or efficiency as a function of the input power.

The above described practical preferred embodiment exhibited a 3 dB threshold bandwidth of approximately 600 MHz relative to the input signal. For wider bandwidths, a balanced implementation using a pair of FET's each configured essentially as shown in FIG. 2 would be advantageous, thereby simplifying the separation of input and output signals.

Although the present Invention has been illustrated in FIGS. 2 and 3 using an FET configured as a common source oscillator, it should be understood that other oscillator configurations. such as grounded gate or grounded drain configurations, could also be used to good advantage.

The prominant features of the present Invention are efficient divider operation, relatively simple implementation, and ease and flexibility of design. These features are a direct consequence of operating the FET in the vicinity of pinch-off where the prominent transconductance nonlinearity offers efficient mixing while simultaneously providing gain to overcome circuit losses in the subharmonic feedback loop. With gain available as an independent parameter, the turn-on threshold of the regenerative divider process can be set at any practical desired level.

Additional information regarding the present Invention is presented in C. Rauscher, "A 16 GHz FET Frequency Divider", 1983 IEEE MTT S Digest, pages 349–351, June 1983. The contents of this article are incorporated herein by reference.

Obviously, numerous (additional) modifications and variations of the present Invention are possible in light of the above teachings. It is therefore to be understood that within the scope of the appended claims, the Invention may be practiced otherwise than as specifically described herein.

What is claimed as new and desired to be secured by Letters Patent of the United States is:

1. A regeneratively oscillating broadband microwave frequency divider circuit comprising:

nonlinear amplifier means for amplifying signals including a three-electrode field effect transistor connected between an input port and an output port, said field effect transistor exhibiting a nonlinear transconductance characteristic, said input port being adapted to receive a first signal having a frequency $f_1$;

said three electrode field effect transistor comprising a gate electrode, a drain electrode, and a source electrode, and being configured as a common source amplifier, said gate electrode forming said input port of said amplifier means and said drain electrode forming said output port of said amplifier means;

biasing means coupled to all three of said electrodes of said field-effect transistor for biasing said transistor at or just short of pinch off such that said field-effect transistor exhibits said nonlinear transconductance characteristic;

feedback means connected across two of said three electrodes of said field effect transistor between said output port and said input port of said nonlinear amplifier means for coupling a second signal having a frequency $f_o$ that is half said frequency $f_1$ from said output port to said input port of said nonlinear amplifier means, said first and second signals combining at said input port to modulate said nonlinear transconductance characteristic of said field effect transistor such that said first and second signals are mixed together and amplified in said field effect transistor to produce said second signal having a frequency $f_o$ that is half said frequency f, said feedback means comprising an inductor and a d.c. blocking capacitor coupled in a nonresonant series circuit between said gate electrode and said drain electrode of said field-effect transistor;

whereby said frequency $f_1$ of said first signal is divided in half by said circuit to produce said frequency $f_o$ of said second signal.

2. A regeneratively oscillating broadband microwave frequency divider circuit comprising: a field-effect transistor having only three electrodes including a gate electrode, a drain electrode, and a source electrode, said field effect transistor being configured as a common source amplifier, said gate electrode being adapted to receive a first signal having a frequency $f_1$;

biasing means coupled to all three of said electrodes of said field-effect transistor for biasing said field-effect transistor at or just short of pinch-off such that said field effect transistor exhibits a nonlinear transconductance characteristic; and feedback means coupled between said drain electrode and said gate electrode of said field-effect transistor for coupling a second output signal having a frequency $f_o$ from said drain electrode back to said gate electrode, said feedback means comprising an inductor and a d.c. blocking capacitor coupled in a nonresonant series circuit between said gate electrode and said drain electrode of said field-effect transistor;

said first and second signals combining at said gate electrode to modulate said nonlinear transconductance characteristic of said field-effect transistor such that said first and second signals are mixed together and amplifed in said field-effect transistor, said frequency $f_o$ being one half said frequency $f_1$, whereby said frequency $f_1$ of said first signal is divided in half by said divider circuit.

* * * * *